(12) United States Patent
Nakanishi et al.

(10) Patent No.: US 6,843,607 B2
(45) Date of Patent: Jan. 18, 2005

(54) THREE-STORIED OPTICAL COMMUNICATIONS MODULE

(75) Inventors: Hiromi Nakanishi, Osaka (JP); Takeshi Okada, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 33 days.

(21) Appl. No.: 10/444,384

(22) Filed: May 23, 2003

(65) Prior Publication Data

US 2003/0231841 A1 Dec. 18, 2003

(30) Foreign Application Priority Data

Jun. 18, 2002 (JP) .................................... 2002-176524

(51) Int. Cl.[7] ................................................ G02B 6/42

(52) U.S. Cl. ............................ 385/92; 385/88; 385/14; 385/89; 385/49

(58) Field of Search .............................. 385/92, 88, 89, 385/24, 49; 359/577, 583, 589

(56) References Cited

U.S. PATENT DOCUMENTS

| | | | | |
|---|---|---|---|---|
| 5,127,075 A | * | 6/1992 | Althaus et al. ............... | 385/94 |
| 5,661,835 A | * | 8/1997 | Kato et al. .................... | 385/92 |
| 6,517,257 B2 | * | 2/2003 | Tohmon et al. ............... | 385/88 |
| 2003/0123819 A1 | * | 7/2003 | Nakanishi et al. ............ | 385/92 |
| 2004/0136662 A1 | * | 7/2004 | Takagi et al. ................. | 385/92 |

FOREIGN PATENT DOCUMENTS

| | | |
|---|---|---|
| JP | 11-218651 | 8/1999 |
| JP | 2001-66473 | 3/2001 |
| JP | 2001-203419 | 7/2001 |

OTHER PUBLICATIONS

Ogusu et al., "Receptacle Type Bi–directional WDM Module I", Proceeding of the 1996 Communications Society Conference of IEICE, C–208, p. 208.

Kuribayashi et al., "Optical Bi–directional Module With WDM Using Silica Waveguides", Proceeding of the 1993 IEICE Fall Conference, C–158, p. 4–238.

Uno et al., "Hybridly integrated LD/PD module with passive–alignment technology", Proceeding of the 1997 Electronics Society Conference of IEICE, C–3–89, p. 198.

* cited by examiner

*Primary Examiner*—Fayez Assaf
(74) *Attorney, Agent, or Firm*—Fish & Richardson P.C.

(57) ABSTRACT

A three-storied structure optical communications module having a top case, a middle case and a bottom case which are piled and coupled in a vertical direction. The middle case has a silicon bench with M (channel number) lightwaveguides, a first $WDM_1$, a second $WDM_2$, M (channel number) laser diodes for generating transmitting signals $\lambda 1$. The top case has a set of $\lambda 2$ receiving photodiodes $PD_1$s of the channel number M. The bottom case has another set of $\lambda 3$ receiving photodiodes $PD_2$s. $\lambda 2$ signal beams and $\lambda 3$ signal beams propagating in optical fibers go into the lightwaveguides on the middle case. The $\lambda 2$ signal beams are reflected midway on the lightwaveguides by the $WDM_1$ upward to the photodiodes $PD_1$s on the top case and are converted into photocurrents by the photodiodes PDs. The $\lambda 3$ signal beams are reflected halfway on the lightwaveguides by the $WDM_2$ downward to the photodiodes $PD_2$s and are converted into photocurrents by the photodiodes $PD_2$s. The $\lambda 1$ yielded by the laser diodes make their way in the lightwaveguides, go into a multichannel fiber and propagate in the multichannel fiber. The three-storied structure allows two sets of M-channel receiving signals and a set of M-channel transmitting signals to be received or transmitted. The three-storied structure enables the module to alleviate a necessary area and reduce optical, electrical interchannel crosstalk.

20 Claims, 8 Drawing Sheets

Embodiment 1

THREE-STORIED OPTICAL COMMUNICATIONS MODULE

BACKGROUND OF THE INVENTION

Field of the Invention

This invention relates to an optical communications module having two sets of M (M;channel number) photodiodes and one set of M laser diodes, suitable for multichannel bidirectional optical communications systems which transmit a variety of optical signals by making use of two kinds of receiving signals $\lambda 2$ and $\lambda 3$ and one kind of a transmitting signal $\lambda 1$ via M channel optical fibers. The optical communications module includes M laser diodes (LDs) for making and transmitting M channel signals of a $\lambda 1$ band, M photodiodes ($PD_1s$) for receiving M channel signals of a $\lambda 2$ band and M photodiodes ($PD_2S$) for receiving M channel signals of a $\lambda 3$ band sealed in a package. The module has 3M optoelectronic device chips (M LDs+2M PDs). There is no device containing so many optoelectronic chips in a package yet.

This application claims the priority of Japanese Patent Application No.2002-176524 filed on Jun. 18, 2002, which is incorporated herein by reference.

A single channel bi-directional optical communications system makes use of a single optical fiber for transmitting downward and upward optical signals in two directions. An LD/PD module for the single channel bi-directional communications should have a laser diode of making transmitting signals, a photodiode of receiving signals and a signal dividing part (e.g., y-branch) for dividing propagating signals into transmitting ones and receiving ones. Requirements imposed upon the signal dividing part are small division loss, small optical crosstalk, weak electromagnetic and electric crosstalk.

Optical crosstalk means noise generation in a photodiode (PD) caused by invasion of strong light beams emitted from a laser diode (LD). The optical crosstalk is a serious problem for simultaneous bi-directional communications. Transmitting signal wavelength $\lambda 1$ emitted from the laser diodes (LD) is different from receiving signal wavelength $\lambda 2$ which has been sent from another port (a subscriber or a station). Conventional photodiodes employed for communications modules have an InGaAs light receiving layer (active layer) which has sensitivity within a wavelength range between 1.0 $\mu$m and 1.6 $\mu$m.

The InGaAs photodiodes sense both $\lambda 1$ and $\lambda 2$. Sensitivity of $\lambda 2$ is a reason for causing optical crosstalk in a simultaneous bi-directional LD/PD module.

Another problem is electrical crosstalk among laser diodes. Strong current for driving lasers leaks in a package and a bench. The strong noise current has an influence upon the driving state of neighboring laser diodes.

Besides, there is also electromagnetic crosstalk among laser diodes and photodiodes. Noise current generates electromagnetic waves which fly in space to the photodiodes of high impedance in the same package and perturb the actions of the photodiodes.

DESCRIPTION OF THE RELATED ART

There have been some different types of allocating a laser diode and a photodiode in a module. FIG. 8 shows a three dimension, separated type which disposes a laser diode 86 along an extension (axial line) of an optical fiber 85, positions a Wavelength Division Multiplexer (WDM) 87 slanting at 45 degrees at a middle point between the fiber 85 and the laser diode 86, and allocates a photodiode 88 along a line vertical to the axial line. A transmitting beam of $\lambda 1$ emitted from the laser diode 86 passes the WDM 87 and is converged into the fiber 85 by a lens. A receiving beam $\lambda 2$ propagating in the fiber 85 goes to the WDM 87, is reflected by the WDM and goes into the photodiode 88.

The module makes use of the WDM for separating light beams of different wavelengths. The WDM is an optical element which is produced by piling two kinds of transparent dielectric films with different refractive indices in turn on a substrate. The WDM plays a role of allowing the first wavelength $\lambda 1$ to pass but reflecting the second wavelength $\lambda 2$ with nearly 100%. The WDM has a definite reflection rate and definite transparency rate for wavelengths other than $\lambda 1$ and $\lambda 2$. People have proposed various modules having wavelength selective filters (WDMs) which reflect 45 degree incidence beams of a definite wavelength and allows 45 degree incidence beams of another definite wavelength to pass without loss.

① Masahiro Ogusu, Tazuko Tomioka and Shigeru Ohshima, "Receptacle Type Bi-directional WDM Module I", Proceeding of the 1996 Electronics Society Conference of IEICE, C-208, p208 (1996).

① has an independently packaged photodiode, an independently packaged laser diode, an independent WDM and a free space for propagation of optical beams. Since the photodiode is packaged in a metallic case, the module has an advantage of no optical crosstalk. Separation of the photodiode from the laser diode by individual cases needs a wide volume, which raises the cost and the volume of the LD/PD module.

Some people have proposed planar type modules having a Y-branched lightwaveguide for dividing optical paths for a signal transmitting portion (LD portion) and a signal receiving portion (PD portion). The module has a silicon bench, Y-branched lightwaveguides formed on the silicon bench, a laser diode laid behind an end of the first lightwaveguide, a photodiode positioned behind an end of the second lightwaveguide and a wavelength selective filter positioned at the y-branch. Another end of the third lightwaveguide is joined to an outer optical fiber. Transmitting light emanating from the laser enters the lightwaveguide, passes the wavelength selective filter, propagates in the third lightwaveguide and goes into the outer fiber to a central station.

② M. Kuribayasi, H. Isono, T. Kunikane, Y. Omori and T. Emori, "Optical Bi-directional Module With WDM Using Silica Waveguides", Proceeding of the 1993 IEICE Fall Conference, C-158, p4–238 (1993).

② proposed a planar type Y-branched LD/PD module having a Y-branch dividing part, a photodiode for sensing 1.55 $\mu$m signals and a laser diode for generating 1.3 $\mu$m signals encapsulated in a common package. ② made a planar module by making Y-branched $GeO_2$ doped $SiO_2$ light waveguides on a silicon bench, installing a WDM at a Y-branch point, laying a photodiode at a final end of a branch, positioning a laser diode at a final end of another branch and joining an outer fiber to an initial point of a stem of the lightwaveguide. The planar Y-branched module has advantages of leveling the laser and photodiode on the same height and small optical crosstalk due to the Y-branch.

However, the Y-branch causes difficulties. Excess curvature will increase bending loss at the Y-branch. Avoiding the excess curvature requires a large length of the lightwaveguide in the vicinity of the Y-branch, which requires a long silicon bench. Since the photodiode and the laser diode are arranged side by side on the bench, the bench should have a large width for reducing electric and electromagnetic crosstalk. The Y-branch and the parallel LD/PD mounting enlarge the module. A single channel planar Y-branch module may be still allowable. Application of the Y-branched module to multichannel devices would lead to an impractical, bulky device. The defect of the bulky module would be more serious for application to multichannel modules having a plurality of lasers and photodiodes.

Someone proposed another type of y-branched modules which have a silicon bench, a Y-branched lightwaveguide made on the silicon bench, a WDM positioned at the branch, a laser diode laid at an initial end of the branch, a photodiode installed at a final end of a stem, and an outer fiber joined to an initial end of another branch. 1.55 µm signals propagating from the outer fiber go into the lightwaveguide via the initial end, pass the WDM straightforward, and enter the photodiode. 1.3 µm signals emitted from the laser diode run in the branch, arrive at the WDM, are selectively reflected by the WDM, propagate in the waveguide and go into the outer fiber.

Somebody proposed a third type of LD/PD modules without Y-branch. The module has a flat bench, a linear lightwaveguide formed on the bench, a WDM slantingly laid on the lightwaveguide for dividing paths in slanting directions, a laser diode mounted at a rear end of the lightwaveguide and a photodiode mounted slantingly above the WDM. Input signals propagating from an outer fiber go into the lightwaveguide, are reflected by the WDM slantingly upward and are supplied to the photodiode.

③ T. Uno, T. Nishikawa, M. Mitsuda, G. Tohmon and Y. Matsui, "Hybridly integrated LD/PD module with passive-alignment technology", Proceeding of the 1997 Electronics Society Conference of IEICE, C-3–89, p198 (1997).

③ suggested an LD/PD module having a silicon bench with a lower front part and a higher rear part with a V-groove, a glass plate with a V-groove mounted upon the lower front part of the silicon bench, an optical fiber fitted commonly on the bench V-groove and the glass V-groove, a laser diode (LD) laid at an extension of the fiber on the rear part of the silicon bench, a WDM inserted into a slanting groove formed by cutting slantingly the fiber and glass plate and a photodiode mounted upon the glass plate just before the WDM. ③ also divided optical paths for the LD and PD in a vertical direction.

The photodiode (PD) should be slightly higher than the laser diode (LD) in ③. The extra glass submount is glued on the silicon bench and the photodiode is mounted on the submount. The submount raises the photodiode to a point higher than the laser. The distance from the WDM to the PD is short. The PD is in contact with the fiber. Difference of heights between the LD and the PD is one or half of the diameter of the fiber. Though the paths are vertically separated by the WDM, the photodiode is nearly on the same level as the laser.

④ Japanese Patent Laying Open No.2001-203419, "LIGHT-EMITTING DEVICE", which was filed by the same applicant as the present invention, proposed a vertical separation path type LD/PD module. The module was assembled by making a longitudinal $SiO_2$ lightwaveguide on a silicon bench, making a lower step at a rear end of the silicon bench, mounting a laser diode on the lower step, building a slanting WDM filter midway on the lightwaveguide, and installing a photodiode slantingly in front of the WDM filter on the lightwaveguide. A path to the photodiode, which is raised by the WDM, is short. The photodiode is mounted just on the lightwaveguide. Difference of heights between the laser and the photodiode is nearly equal to one or half of thickness of the lightwaveguide. Though the paths are separated in a vertical direction by the WDM, the laser and the photodiode are laid nearly on the same level.

⑤ Japanese Patent Laying Open No.11-218651, "OPTICAL TRANSMISSION AND RECEPTION MODULE", which was filed by the same applicant as the present invention, proposed a module having a common ground metallize, an LD part built on a top surface of the common ground metallize, a PD part formed on a bottom surface of the metallize. FIG. 9 shows a sectional view of the module proposed by ⑤. ⑤ has a first plate 95 with a vertical hole and a second plate 99 with another vertical hole. The first plate 95 and the second plate 99 sandwich a common ground metallize G. The first plate 95 is a transmitting portion having an end of a fiber 105, a lightwaveguide 96, a wavelength division multiplexer (WDM) 97 and a laser diode 98 aligning along an extension of the fiber 105. The second plate 99 is a receiving portion having a photodiode (PD) 102 below the vertical hole and a preamplifier (AMP) 103 fitted on the bottom.

A λ1 transmitting signal light beam emitted from the laser diode (LD) 98 goes into the lightwaveguide 96, passes the WDM 97, and enters the fiber 105. A λ2 receiving signal light beam running in the fiber 105 goes into the lightwaveguide 96 and shoots the WDM 97. The λ2 beam is reflected by the WDM 97 downward into the vertical holes and is guided to the photodiode 102. The photodiode 102 yields photocurrent in proportion to the receiving light signals. The preamplifier $AMP_1$03 amplifies the photocurrent. The middle ground metallize G is commonly connected both to the LD part and to the PD part. The middle ground metallize G prevents electromagnetic noise produced at the LD part from invading the photodiode. The module makes use of the WDM for dividing LD and PD optical paths in a vertical direction. A long path from the WDM to the photodiode (PD) enables the photodiode to separate far from the lightwaveguide 96 and the laser 98, which reduces optical noise for the photodiode 102. Separation of the PD part from the LD part by two plates 95 and 99 succeeds in suppressing the optical noise. The ground G decreases electromagnetic noise. The double insulating plates reduce electric noise. ⑤ was a sophisticated LD/PD module contrived by the applicant.

⑤ had been contrived as a single-channel transmitting/receiving module or an ONU (optical network unit). ⑤ had a single laser diode (LD), a single photodiode and a single lightwaveguide. There was no need for installing a plurality of pairs of lasers and photodiodes. Furthermore, the inventors found a surprising aspect that the middle ground G between the LD part and the PD part acts to increase noise by playing a role of an antenna emitting LD signals instead of decreasing electromagnetic crosstalk. The silicon plates 95 and 99 are semi-conductive, which incurs electric crosstalk via the silicon plates.

There have been little requirements for multichannel modules including a plurality of pairs of lasers and photodiodes. Almost all modules which have been proposed so far have been single channel modules with a single pair of a laser and a photodiode. Multichannel modules will be required in near future.

Multichannel modules are favorable for modules equipped at a central station, for saving a space for accommodating modules. In addition to the multichannel communications, some of single channel modules require both an analog receiving portion and a digital receiving portion. The multichannel communications would require a hybrid single channel module having a laser (LD) and two photodiodes (PDs). An M-channel analog/digital communications would demand a 3M channel module including 3M optoelectronic devices in a package. A central station, which treats with many subscribers (ONUs), will demand small-sized, low cost multichannel modules.

A multichannel three function module having 3M chips (M; channel number) requires being a small-sized module by curtailing a volume per chip. The multichannel module should be immune from optical, electrical and electromagnetic crosstalk.

What requires multichannel optical communications modules? Why multichannel systems are demanded? The reason should be clarified before describing contrivances of the present invention. The present invention aims at an improvement of bidirectional simultaneous optical communications.

At an early stage, a 1:16 communications network had been investigated. The 1:16 network joins a single optical fiber starting from a station to sixteen fibers deriving from sixteen subscribers (ONUs: optical network units) at a 1:16 coupler installed near the subscribers. N denotes the number of subscribers (ONUs). The number of fibers connecting the station to the subscribers can be reduced from N to N/16. The prototype 1:16 network had advantages of alleviating the number of necessary optical fibers and reducing the number of station modules for delivering signals to the subscribers. On the contrary, the 1:16 network turned out to have weak points of complexity of a controlling system and lack of elasticity of designing.

A simpler system which uses a single fiber per subscriber (1:1 type) becomes more promising than the prototype 1:16 system. Without branching couplers, the simple system needs N fibers for connecting the station to N subscribers (ONUs). The simple system allocates one independent fiber to one subscriber. Use of independent fibers enables the system to add extra functions. However, the simple system would have a drawback of a vast increment of the number of modules equipped at the central station.

In the case, it would be preferable for a station to have complex modules having four, eight, sixteen, . . . pairs of lasers and photodiodes. The number of modules equipped at the station can be reduced from N to N/4, N/8, N/16, . . . , where N is the number of subscribers. Namely, the central stations prefer multichannel modules to single-channel ones for reducing the total number of modules.

In near future, digital/analog hybrid communications systems having analog channels and digital channels will be requested. For example, when telephones and facsimiles are transmitted as digital signals and television broadcasting is transmitted as analog signals, the downward signals will include analog and digital signal modes. In the case, a subscriber requires a single channel three device type module having $LD(\lambda 1)+PD(\lambda 2)+PD(\lambda 3)$. A central station should equip many three device type modules having a plurality of sets of $LD(\lambda 1)+PD(\lambda 2)+PD(\lambda 3)$. The present invention will give multichannel three device type modules to a central station as well as single channel three device type modules to subscribers.

A purpose of the present invention is to provide a small sized multichannel LD/PD module which can include a plurality of sets of LD/2PD. Another purpose of the present invention is to provide a low-cost LD/PD module which can reduce cost per channel. A further purpose of the present invention is to provide an LD/PD module which can alleviate optical crosstalk, electrical crosstalk and electromagnetic crosstalk between LDs and PDs and between PDs and PDs.

SUMMARY OF THE INVENTION

The present invention proposes a three-storied module having a top case including $\lambda 2$ receiving photodiodes $PD_1$ and $PD_1$ leadpins, a middle case including a connector with fibers, a lightwaveguide-carrying silicon bench, a first $WDM_1$, a second $WDM_2$, $\lambda 1$ transmitting laser diodes LDs and LD leadpins, a bottom case including $\lambda 3$ receiving photodiodes $PD_2$ and $PD_2$ leadpins, the top, middle and bottom cases being piled and unified in a vertical direction, a transparent resin filling the top, middle and bottom cases, and a package encapsulating the top, middle and bottom cases. $\lambda 1$ transmitting signal beams are yielded by the lasers (LD), go into the lightwaveguide on the silicon bench, pass the $WDM_2$ and WDM, and propagate in the fibers. $\lambda 2$ receiving signal beams run in the fibers downward, go into the lightwaveguides on the silicon bench, are reflected upward by the $WDM_1$, and are guided into the photodiodes $PD_1$ in the top case. $\lambda 3$ receiving signal beams run in the fibers downward, go into the lightwaveguides on the silicon bench, are reflected downward by the $WDM_2$, and are guided into the photodiodes $PD_2$ in the bottom case.

Floor holes have been perforated on the top case and the middle case for allowing receiving signal beams to pass therethrough. Sets of multichannel beams coming from a ribbonfiber and propagating in the lightpaths are divided into upward beams $\lambda 2$ and into downward beams $\lambda 3$ by two WDMs (wavelength division multiplexers). The upward $\lambda 2$ beams pass the upper floor holes and enter the upper photodiodes PD, in the top case. The downward $\lambda 3$ beams pass the middle floor holes and enter the lower photodiodes $PD_2$ in the bottom case. The upper photodiodes $PD_1$ are separated from the middle laser diodes LDs by the upper (top) case bottom. The lower photodiodes $PD_2$ are separated from the middle laser diodes LDs by the middle case bottom. Since the cases are opaque, optical crosstalk between the PDs and the LDs is greatly suppressed.

The cases which are not silicon but plastics or ceramics, are insulators. The top floor is insulated by the upper case from the middle floor. The bottom floor is electrically separated from the middle floor by the insulating middle case. Electrical crosstalk between the laser diodes and the photodiodes is depressed by the isolation of the insulating cases. Electrical circuits are also separated. The middle floor has an individual electrical circuit for the laser diodes prepared in the middle case. The top floor has another individual electrical circuit for the upper set of photodiodes $PD_1$ (and preamplifiers). The bottom floor has another separated electrical circuit for the bottom set of the photodiodes $PD_2$. Separation of wirings is effective for suppressing electrical crosstalk. Unlike the known ⑤, the present invention has no common ground metallize. Lack of the common grounds is effective for suppressing electromagnetic crosstalk.

The inventors have noticed that insertion of a common ground between the transmitting part and the receiving part suggested by ⑤ increases electromagnetic crosstalk by playing a role of an antenna contrary to the common sense of electronics technology. The present invention excludes such a common ground metallize from the modules for avoiding the problem of common ground-induced electromagnetic crosstalk.

The highest story and the lowest story are provided with photodiodes $PD_1$ and $PD_2$ for sensing different receiving light signals with different wavelengths $\lambda 2$ and $\lambda 3$. The middle story is provided with laser diodes LDs for producing transmitting light signals with a wavelength $\lambda 1$. Two wavelength division multiplexers WDM$_1$ and WDM$_2$ enable the three stories to arrange sets of the highest PD$_1$s ($\lambda$2), lowest PD$_2$s ($\lambda$3) and middle LDs($\lambda$1). The transmitting light signals $\lambda$1 does not fly in space. The receiving light signals $\lambda$2 and $\lambda$3 experience space flight. A transparent resin should be preferably filled in the cases for the sake of the space flight. The transparent resin with a refractive index akin to the lightwaveguides has a function of reducing reflection loss. If an inertia gas were filled in the package instead of resin, the reflection loss would be large at interfaces. Elastic silicone resins are suitable for reducing the loss. Filling of the elastic resin has another function of protecting the devices by alleviating external shock.

The whole of the piled three cases is molded by an opaque, hard resin as a plastic package, for example, an epoxy resin. The present invention allocates a set of LDs and WDMs on the middle floor, a first set of PDs on the top (highest) floor and a second set of PDs on the lowest (bottom) floor for reflecting receiving signals by the WDMs on the middle. Three sets of LDs, PDs and PDs are disposed in a vertical direction. Vertical arrangement of the devices can curtail horizontal sizes. The storied structure enables the present invention to align a plurality of same function chips (LDs and PDs) chip by chip. The present invention is suitable for multichannel LD&2PD modules.

The present invention proposes the three-storey module with the upper case, the middle case, and the bottom case for allotting a PD$_1$ set, a PD$_2$ set and an LD set to different storeys at different heights. Vertical separation of the PD$_1$ set and PD$_2$ set from the LD set enables the module to decrease electric, optical and electromagnetic crosstalk between LDs and PDs. The vertical arrangement allows the module to alleviate an occupying area and to reduce the size of the module. The three-story PD$_1$/LD/PD$_2$ modules are suitable for multichannel optical communications due to the reduction of a size and the decrease of interchannel crosstalk. The channel number is, for example, four, eight, sixteen or so.

DETAILED DESCRIPTION OF THE PREFERRED EMBODIMENTS

Figure 1:
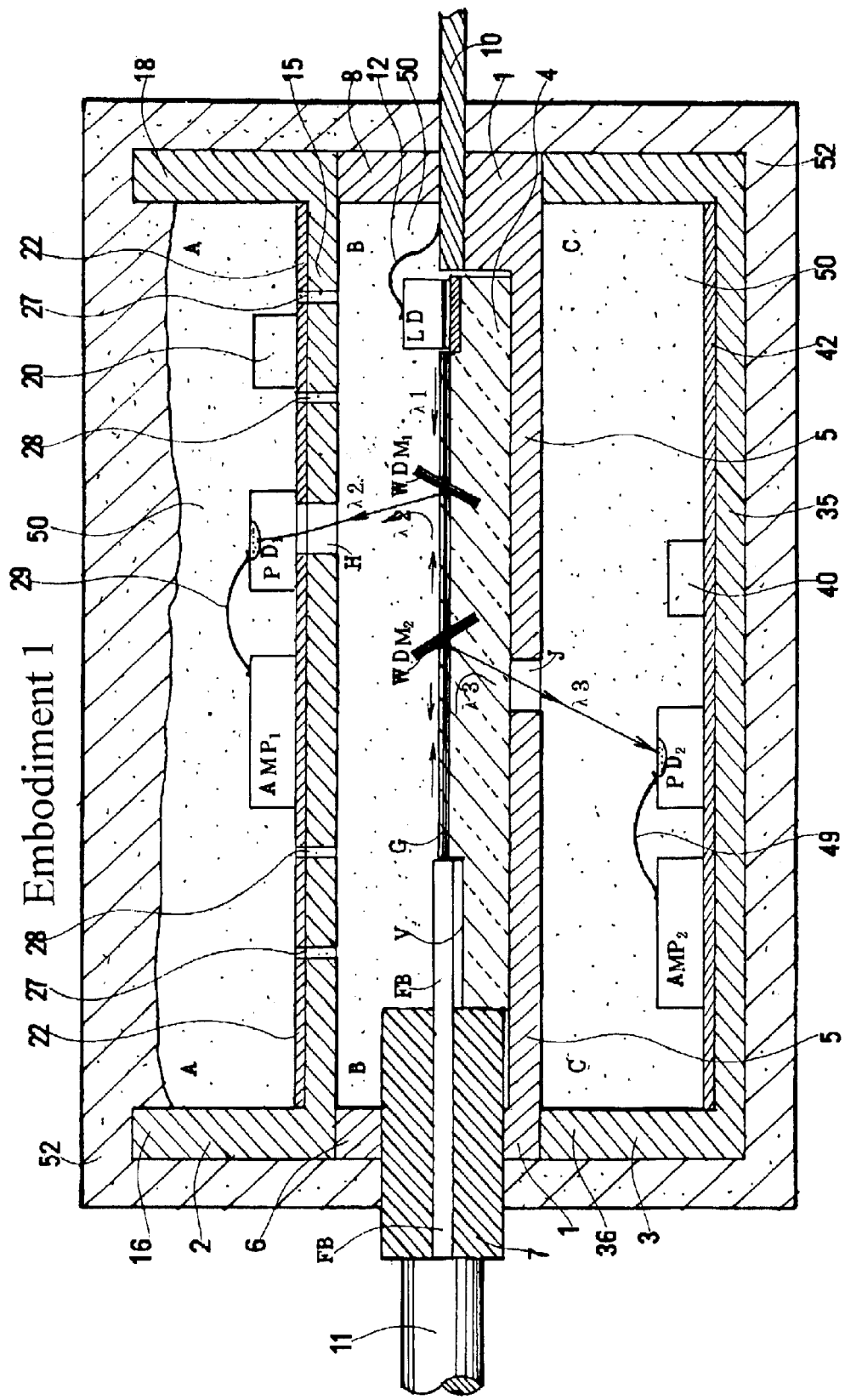
FIG. 1 is an axially sectioned side view of Embodiment 1 of a multichannel PD/LD/PD module having a top case (PD$_1$s), a middle case (lightwaveguides & LDs) and a bottom case (PD$_2$s).

The present invention makes use of three cases, i.e., top, middle and bottom cases, and allots the middle case to a transmitting (LD) part, the top and bottom cases to receiving (PD) parts. The transmitting portion maintains a connector, a silicon bench with waveguides, a wavelength division multiplexers (WDM$_1$ and WDM$_2$), a set of laser diodes (LDs), and a set of LD leadpins. The top case contains a set of $\lambda$2 receiving photodiodes (PD$_1$s), a set of PD leadpins, optionally and a set of preamplifiers for amplifying photocurrents of the PD$_1$s.

The bottom case contains a set of $\lambda$3 photodiodes (PD$_2$s), a set of PD leadpins, optionally and a set of preamplifiers for amplifying photocurrents of the PD$_2$s.

Receiving light signals $\lambda$2 and $\lambda$3 propagate in ribbonfibers, a connector and waveguides to the WDM$_1$ and WDM$_2$. $\lambda$2 light is reflected upward by the WDM$_1$ to the PD$_1$s on the top floor. $\lambda$3 light is reflected downward by the WDM$_2$ to the PD$_2$s on the bottom floor. The LDs produce transmitting signal light $\lambda$1, which is introduced into the waveguides. Propagating in the waveguides, $\lambda$1 passes the WDM$_1$ and WDM$_2$ with little loss. Three-storied cases are supplied with a transparent resin having a refractive index similar to the waveguides for decreasing reflection/scattering loss at interfaces. A hard rigid resin encapsulates the three-storied cases.

There are six allowable modes of pairing one of LDs, PD$_1$s and PD$_2$s with one of $\lambda$1, $\lambda$2 and $\lambda$3. Furthermore, if the module employs a 1.3 $\mu$m band, 1.4 $\mu$m band and 1.55 $\mu$m band as $\lambda$1, $\lambda$2 and $\lambda$3, the pairing allows six probable choices. Of course, this invention is applicable to all probable allotments.

For avoiding confusion and clarifying mutual relations, $\lambda$1 is determined to a transmitting signal wavelength emitted by the laser diodes (LDs), $\lambda$2 is assigned to a receiving wavelength sensed by the upper photodiodes (PD$_1$s) and $\lambda$3 is allotted to another receiving wavelength detected by the bottom photodiodes (PD$_2$s). What selectively reflects $\lambda$2 is the first WDM$_1$. The second WDM$_2$ reflects $\lambda$3.

The wavelengths $\lambda$1, $\lambda$2 and $\lambda$3 correspond to anyone of a 1.3 $\mu$m band, 1.4 $\mu$m band and 1.55 $\mu$m band. Multichannel communications makes use of many different wavelengths for a single band for exchange signals with many subscribers. The 1.3 $\mu$m band includes a plurality of wavelengths which are close to 1.3 $\mu$m but are slightly different with each other. The number of the different wavelengths is equal to the channel number M. The 1.4 $\mu$m band also includes M different wavelengths akin to 1.4 $\mu$m. The 1.55 $\mu$m has M different wavelengths. Thus, M optoelectronic devices are required for M different wavelengths. M denotes, therefore, the channel number, the wavelength number and the device number. The WDM$_1$ and WDM$_2$ have complex dialectic multilayered structures for selecting different wavelengths. Contrivances enable two WDMs to divide the three wavelength bands.

[Top floor (upper case, highest floor; PD$_1$s; $\lambda$2)]

The top floor accommodates M $\lambda$2-photodiodes PD$_1$s for sensing $\lambda$2 beams, metallized patterns, wires and leadpins on an upper case. The upper case has holes for guiding M-channel beams. Optionally, M preamplifiers AMP$_1$ for amplifying photocurrents of the M photodiodes PDs are installed on the upper floor. In addition, the upper floor can include capacitors for stabilizing source voltages or other electric elements. The photodiodes ($PD_1$s), the preamplifiers and the electric elements are connected by wires to the metallized patterns. The M-channel photodiodes are denoted by suffixing as $PD_{1a}$, $PD_{1b}$, ..., $PD_{1M}$.

[Middle floor (middle case; λ1; LDs, $WDM_1$, $WDM_2$)]

The middle floor contains M λ1 emitting laser diodes (LDs), M first wavelength selective filters ($WDM_1$s; wavelength division multiplexers), M second wavelength selective filters ($WDM_2$s), a silicon bench having M V-grooves, metallized patterns, wires and leadpins. The laser diodes (LDs) and metallized patterns are connected to the leadpins via wires. The M channel laser diodes can be individually expressed by suffixing as $LD_a$, $LD_b$, $LD_c$, ..., $LD_M$. The first wavelength selective filters, which align in a lateral direction in a slanting groove, are denoted by suffixing as $WDM_{1c}$, $WDM_{1b}$, $WDM_{1c}$, ..., $WDM_{1M}$. The $WDM_1$s reflect λ2 beams. The λ2 beams include M different wavelengths in M channel communications. The $WDM_{1a}$, $WDM_{1b}$, $WDM_{1c}$, ..., $WDM_{1M}$ are different in the layered structure in a rigorous case. However, when the wavelength differences between neighboring channels are sufficiently small in three bands, a common $WDM_1$ can discern λ1 from λ2 and λ3. Second wavelength selective filters $WDM_2$s are similar to the first $WDM_1$s.

[Bottom floor (lowest case; $PD_2$; λ3)]

The bottom floor accommodates M λ3-photodiodes $PD_2$s for sensing λ3 beams, metallized patterns, wires and leadpins in a lowest case. Optionally, M preamplifiers ($AMP_2$s) for amplifying photocurrents of the M photodiodes $PD_2$s are installed on the bottom floor. In addition, the lowest floor can include capacitors for stabilizing source voltages or other electric elements. The photodiodes ($PD_2$s), the preamplifiers and the electric elements are connected by wires to the metallized patterns. M-channel photodiodes are denoted by suffixing as $PD_{2a}$, $PD_{2b}$, ..., $PD_{2M}$.

[Transparent resin]

λ2 beams reflected by $WDM_1$ and λ3 beams reflected by $WDM_2$ propagate in free space. Inner rooms in the upper, middle and lower cases are filled with a transparent resin without air gap for reducing reflection or scattering of the beams at interfaces between the fibers/waveguide and the free space. The conditions imposed upon the resin are transparency and a refractive index similar to the fibers (refractive index n=1.43). Candidates are transparent silicone resins or transparent acrylate resins, which have a refractive index nearly equal to silica fibers. The transparent resin, which maintains residual elasticity after hardening, has an advantage of protecting photodiodes, lasers, preamplifiers and wires from outer shock.

[Bench (substrate)]

The bench is a base for building lightwaveguides, WDMs and laser diodes. A good candidate for the bench is a silicon single crystal substrate. Besides, ceramic benches or polymer benches are also available.

[Cases]

The upper, middle and lower cases can be produced by insert-molding a leadframe with a resin in a metallic die. Insert-molding dispenses with an extra step of printing metallized patterns on cases. A candidate resin is a liquid crystal polymer, which gives low-cost cases. However, ceramic cases are more sophisticated candidates for the upper, middle and lower cases. In this case, metallizes are made by printing or evaporation on the ceramic case and leadpins are brazed to peripheral metallizes on the ceramic case. The ceramic cases are rich in airtight sealing, reliability and thermal diffusion.

[Lightwaveguides]

Polymer lightwaveguides excel in productivity and cost. If the bench is a silicon substrate, quartz lightwaveguides are congenial to the bench. The quartz waveguide is a set of a $SiO_2$ cladding layer and a $GeO_2$ doped $SiO_2$ core enclosed by the cladding. The quartz lightwaveguide has an advantage of loss lower than the polymer lightwaveguide. The present invention is applicable both to the silicon and the polymer lightwaveguides.

[Number M of LD, $PD_1$, $PD_2$)]

The module of the present invention contains one or more than one transmitting/receiving unit. The number of the units is denoted by M ($M \geq 1$). It is convenient to determine M as a multiple of four. For example, M=4, M=8, M=12, M=16, M=24 or M=36 are suitable candidates. M is equal to the number of the fibers and the number of the channels. Then, M can be called as a channel number. The present invention allots $PD_1$s, LDs and $PD_2$s to the upper floor, the middle floor and the bottom floor respectively. Vertically divided allocation of $PD_1$s, LDs and $PD_2$s saves a horizontal area of the module. Vertical division of a plurality of LD/2PD sets. Thus, the present invention is suitable for multichannel communications modules.

An optical communications system includes a central station, a plurality of subscribers (ONUs) and fibers connecting the station to the subscribers. In general, a λ1 (1.3 μm) band is assigned to upward signals from the subscribers to the central station. A λ2 (1.48 μm) band and λ3(1.55 μm) band are assigned to downward signals from the central station to the subscribers. In this case, λ1 is a transmitting light wavelength generated by a laser, λ2 is a receiving light wavelength and λ3 is another receiving light wavelength in the subscribers. The relation is reverse at the central station.

The number of the subscribers is denoted by N. The ONU module is a single channel module (M=1) having a single set of one laser and two photodiodes. On the ONU, λ1 is LD light (1.3 μm), λ2 is a digital receiving light (1.48 μm) and λ3 is an analog receiving light (1.55 μm). On the contrary, multichannel modules are more favorable than single channel ones for the central station. The number of necessary modules can be reduced from N to N/M by employing M-channel modules at the central station.

[Leadframe]

The upper case and the lower case are complex packages unified to a metal leadframe. Insert-molding produces plastic cases unified with metallic leadframes. Photodiodes should be loaded not upon the silicon bench but upon the leadframe. Receiving beams reflected by the WDM pass the floor holes of the upper and middle cases and go into photodiodes. The floor holes are perforated not on the rigid silicon bench but are preliminarily bored on the thin metal leadframe at a preparatory step of making leadframes. There is no step for boring the floor holes on the cases.

The aforementioned known reference ⑤ Japanese Patent Laying Open No.11-218651 includes a step of perforating a throughhole on a rigid silicon bench by a drill for guiding receiving light to the bottom of the bench, which requires much time and skill. Silicon is a hard material. It is not an easy task to pierce a throughhole from top to bottom by mechanical tools. Wet etching or dry etching cannot pierce such a deep hole in silicon. The present invention, which perforates holes on plastic cases at the time of molding, is far feasible than ⑤.

[Optical crosstalk]

The present invention enjoys an advantage of reduction of optical crosstalk, electric crosstalk and electromagnetic crosstalk in addition to the merit of reduction of a unit volume per a PD or per an LD. The three storey structure enables the middle, upper case bottoms to protect the upper photodiodes PD$_1$s and bottom photodiodes PD$_2$s from middle strong LD stray rays. Optical crosstalk is suppressed by the opaque case floors of the three storey package. The opaque package is effective for shielding strong LD light in the present invention. Silicon in the known ⑤, which is transparent for wavelengths from 1 µm to 1.6 µm, is impotent to shield near-infrared light of 1 µm to 1.6 µm to the contrary.

[Electric crosstalk]

The present invention separates the first set of photodiodes PD$_1$s and the second set of photodiodes PD$_2$s from the set of laser diodes LDs in vertical directions and the horizontal directions by the cases and the resin. The distance and the resin succeeds in decreasing electric crosstalk between the LDs and the PDs. The aforementioned known reference ⑤ Japanese Patent Laying Open No.11-218651 intervenes an LD and a PD with a silicon bench. But, silicon is not an insulator but a semiconductor having sufficient conductivity. The isolating silicon bench itself conducts electricity and causes electric crosstalk between the LD and the PD in ⑤. On the contrary, the present invention succeeds in reducing the electric crosstalk by isolating the PDs from the LDs by the insulating plastic cases.

[Electromagnetic crosstalk]

The present invention separates the photodiodes PD$_1$s and PD$_2$s from the laser diodes LDs in horizontal and vertical directions and isolates the grounds and the power source patterns on the three floors. The distance and the isolation of the grounds and patterns succeeds in alleviating electromagnetic crosstalk between the LDs and the PD$_1$s or PD$_2$s. The aforecited known reference ⑤ Japanese Patent Laying Open No.11-218651 sandwiches a single ground metallize with a PD-carrying silicon bench and an LD-carrying silicon bench. The silicon benches intervene between an LD and a PD. The ground is a common ground for both the LD circuit and the PD circuit. OS thought that the bisecting common ground would be effective to shield electromagnetic waves from the LDs to the PDs.

But, the truth is otherwise. The thin metal ground with high resistance cannot be a true ground but acts as an antenna for causing electromagnetic noise. Strong currents or electromagnetic signals from the laser diodes fluctuate the level of the thin metal ground in ⑤. The ground level of the photodiode circuit is perturbed by the fluctuation of the common metal ground. Then, the ground of the preamplifier accompanying the photodiodes fluctuates, which induces large electromagnetic noise in the receiving signals. This is an origin of electromagnetic crosstalk between the laser diode and the photodiode.

[EMBODIMENT 1 (Upper PD$_1$s, Middle LDs, Lower PD$_2$s; FIGS. 1 to 4)]

Figure 2:
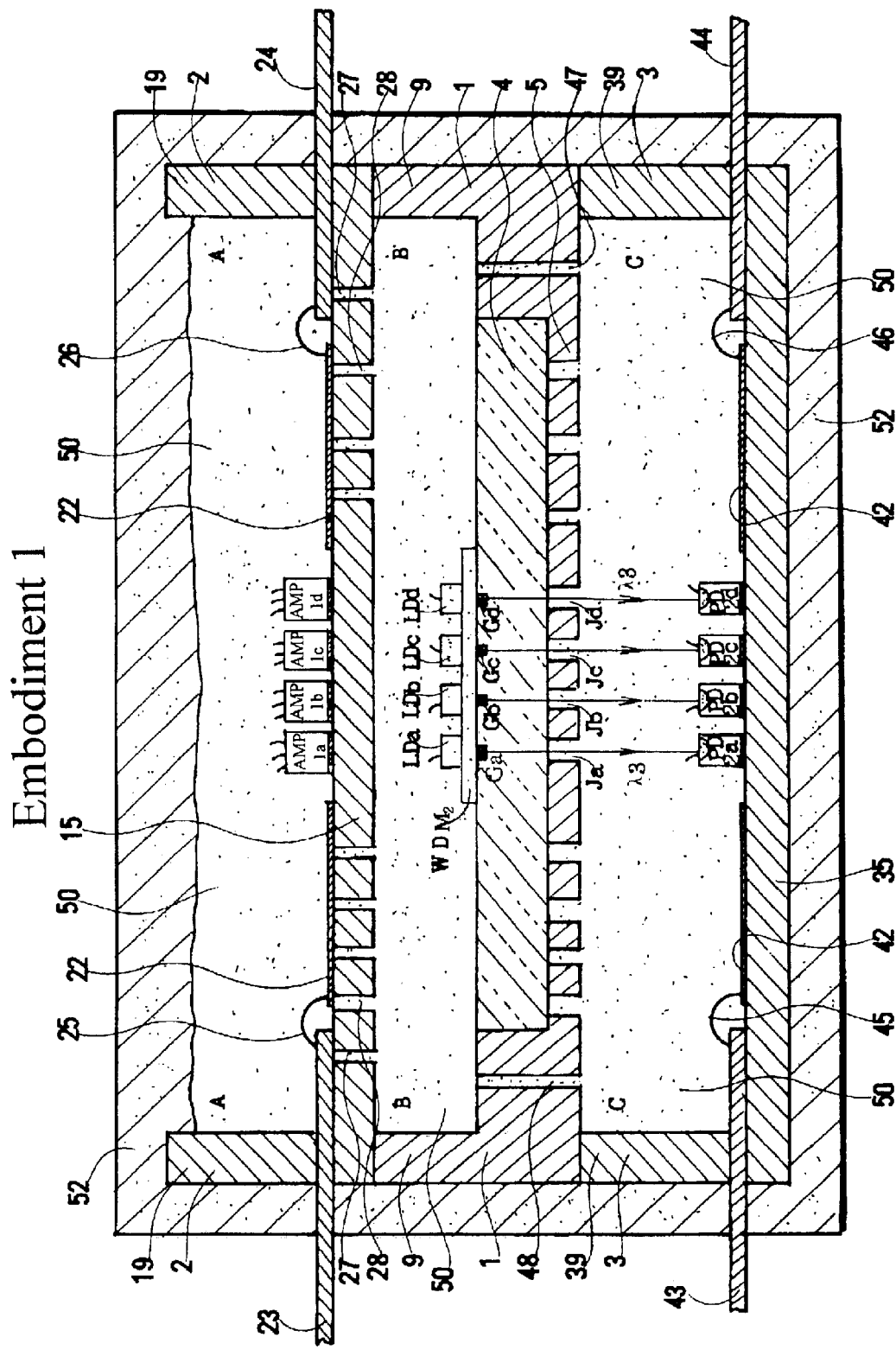
FIG. 2 is a laterally sectioned front view of Embodiment 1 for showing $\lambda$3 receiving beams being reflected down by a second WDM$_2$ and going into the photodiodes (PD$_2$) in the bottom case.
Figure 3:
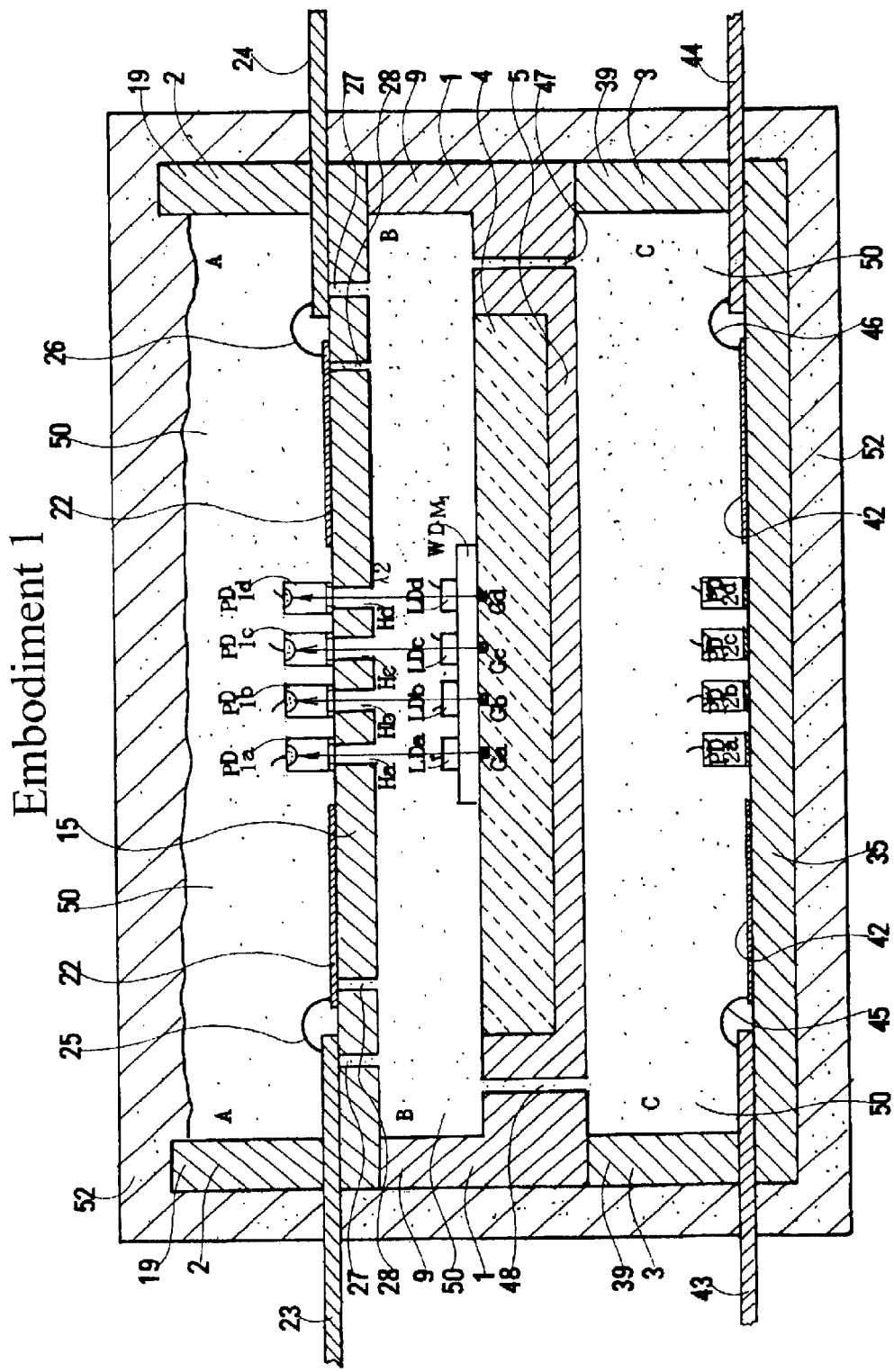
FIG. 3 is a laterally sectioned front view of Embodiment 1 for showing $\lambda$2 receiving beams being reflected upward by a first WDM$_1$ and going into the photodiodes (PD$_1$) in the top case.

FIG. 1 shows a vertically sectioned side view of Embodiment 1 allotting a first set of photodiodes PD$_1$s to an upper floor, a set of laser diodes to a middle floor and a second set of photodiodes PD$_2$s to a lower floor. FIG. 2 is a laterally sectioned front view for showing lightpaths of λ3 being downward reflected by a second WDM$_2$ at the middle floor, passing middle floor holes and going into the photodiodes PD$_2$s at the bottom floor in Embodiment 1. FIG. 3 is another laterally sectioned front view for showing lightpaths of λ2 being upward reflected by a first WDM, at the middle floor, passing upper floor holes and going into the photodiodes PD$_1$s at the top (upper) floor in Embodiment 1.

A package has a three-storeyed structure consisting of a lower case 3, a middle case 1 and an upper case 2.

This is an example of a four channel module (M=4). An eight channel, sixteen channel or one channel can be easily built by the teaching of the present invention.

The middle case 1 is a top-opening vessel having a bottom plate 5, a front wall 6, a rear wall 8 and side walls 9. An inner space enclosed by the middle case 1 is named a middle floor B. The middle case 1 has a cavity for accommodating a silicon bench 4. The silicon bench 4 is a rectangular silicon single crystal plate. Lightwaveguides $G_a$, $G_b$, $G_c$ and $G_d$ are formed parallel in the longitudinal direction upon the silicon bench 4. The lightwaveguides are made from fluoric polyimide. A core/clad structure is formed by differentiating refractive indices by doping the core or clad with an impurity. The resin lightwaveguides have advantages of low cost and facile fabrication.

Otherwise, silica lightwaveguides can be produced by oxidizing a surface of the silicon bench 4 into silicon dioxide ($SiO_2$). The dielectric lightwaveguides have an advantage of low propagation loss in spite of complicated fabrication and high cost. FIG. 1, which is a vertical section cut along a longitudinal line, shows a lightwaveguide G on the silicon bench 4. Four parallel lightwaveguides $G_a$, $G_b$, $G_c$ and $G_d$ are made on the silicon bench as shown in FIG. 2. FIG. 2 and FIG. 3 exhibit an example of a four channel (M=4). Eight, sixteen, lightwaveguides are also available on the silicon bench. Four channel transmitting parts including laser diodes $LD_a$, $LD_b$, $LD_c$ and $LD_d$ behind ends of the lightwaveguides on a rear region of the silicon bench.

V-grooves $V_a$, $V_b$, $V_c$ and $V_d$ are made at a front region of the lightwaveguides by anisotropic etching. The middle case 1 has a front aperture. An optical connector 7 is sustained in the front aperture of the front wall 6.

The connector (MT connector) 7 maintains terminals of element fibers $FB_a$, $FB_b$, $FB_c$ and $FB_d$ of a four channel ribbonfiber. The element fibers are cut at points behind the connector 7 into short tails.

The cut short tails of the ribbonfiber are embedded onto the V-grooves $V_a$, $V_b$, $V_c$ and $V_d$ on the silicon bench 4. The number of fibers, the number of lightwaveguides and the number of V-grooves are all the same (M). The laser diodes $LD_a$, $LD_b$, $LD_c$ and $LD_d$ are mounted on the rear region of the silicon bench 4. The number of the LDs is also equal to the channel number M.

In the example, the top and bottom cases dispense with silicon benches. The middle floor B makes use of a silicon bench for aligning optical axes of the laser diodes $LD_a$, $LD_b$, $LD_c$ and $LD_d$, the lightwaveguides $G_a$, $G_b$, $G_c$ and $G_d$ and the optical fibers $FB_a$, $FB_b$, $FB_c$ and $FB_d$ with accuracy. The middle case has a plurality of outward extending leadpins 10 which have been insert-molded with the case. Electrodes (cathodes and anodes) of the laser diodes $LD_a$, $LD_b$, $LD_c$ and $LD_d$ are joined to the leadpins 10 with wires 12. In the example, four laser diodes $LD_a$, $LD_b$, $LD_c$ and $LD_d$ are connected with eight wires to the leadpins 10, though one wire 12 appears in FIG. 1. In the middle floor, two wavelength selective filters WDM$_1$ and WDM$_2$ are mounted at an intermediate region of the lightwaveguides for selectively reflecting receiving signal light λ2 and λ3 upward and downward.

The WDM$_1$, which is closer to the lasers (LDs) than the WDM$_2$, is slanting upward at an angle of 30 degrees. The WDM$_1$ reflects a set of receiving beams λ2 propagating in the fibers FBs slantingly upward but allows transmitting beams λ1 emanating from the lasers (LDs). The λ2 beams are sensed by the upper photodiodes PD$_1$s on the upper floor A.

The WDM$_2$, which is closer to the fibers (FBs) than the WDM$_1$, is slanting downward at 30 degrees. The WDM$_2$ reflects another set of receiving beams λ3 propagating in the fibers FBs slantingly downward but allows transmitting beams λ1 emanating from the lasers (LDs). The λ3 beams are detected by the lower photodiodes $PD_2$s on the ground floor C. The λ3 is infrared light. The silicon bench 4 is transparent to λ3. There is no hole on the silicon bench. But, the bottom plate 5 is opaque for λ3. Perforation of beam-guiding holes $J_a$, $J_b$, $J_c$ and $J_d$ on the bottom plate 5 is necessary for guiding λ3 from the middle floor B to the lower floor C. In addition to the beam-guiding holes, the bottom plate 5 of the middle case I has bores 47 and 48 for allocating the lowest floor C with a transparent resin 50.

The upper case 2 is a resin-made rectangular package with a top opening. An inner space encapsulated by the upper case 2 is an upper floor A. The upper case 2 has a front wall 16, a back wall 18, a bottom plate 15, side walls 19 and 19. A plurality of metallized patterns 22 are printed on the bottom plate 15. M channeling (M=4) photodiodes $PD_{1a}$, $PD_{1b}$, $PD_{1c}$ and $PD_{1d}$ are mounted on metallized pads on the bottom for receiving light signals λ2 selectively reflected by the first $WDM_1$ laid on the middle floor. The figures denote bottom incidence type photodiodes epi-up fixed on the pads. Otherwise, top incidence type photodiodes can be epi-down mounted on the pads for sensing light signals for the $WDM_1$.

Holes $H_a$, $H_b$, $H_c$ and $H_d$ are perforated on the bottom plate 15 of the upper case 2 for guiding light beams reflected by the $WDM_1$ of the middle floor B. Preamplifiers $AMP_{1a}$, $AMP_{1b}$, $AMP_{1c}$ and $AMP_{1d}$ are installed adjacently to the photodiodes $PD_{1a}$, $PD_{1b}$, $PD_{1c}$ and $PD_{1d}$ for preamplifying photocurrents induced in the photodiodes. Electric elements 20 are furnished for shielding photodiode circuits from external noise. Lots of leadpins 23 and 24 are fixed in holes of the side walls 19 of the upper case 2. Metallized patterns 22 formed on the bottom 15 are joined by wires 25 and 26 to the leadpins 23 and 24. Details of wirings between the metallizes and the leadpins are omitted in the figures.

Wires 29 connect the photodiodes $PD_1$s to the preamplifiers $AMP_1$s. Some of the electric elements 20 are joined by wires (omitted) to the $PD_1$s and $AMP_1$s. The leadpins are provided to the case by insert-molding a leadframe with a resin in a metallic mold. Several resin-guiding holes 27 and 28 are perforated on the bottom 15 of the upper floor. The resin-guiding holes allow a fluid resin to flow down into and fill the lower floors B and C overall.

The lower case 3 is also a resin rectangular vessel with a top opening. An inner space encapsulated by the lower case 3 is a lower floor C. The lower case 3 has a front wall 36, a back wall 38, a bottom plate 35, and side walls 39 and 39. A lot of metallized patterns 42 are printed on the bottom plate 35. M channeled (M=4) photodiodes $PD_{2a}$, $PD_{2b}$, $PD_{2c}$ and $PD_{2d}$ are mounted on metallized pads on the bottom for receiving light signals selectively reflected by the second $WDM_2$ laid on the middle floor. The figures denote top incidence type photodiodes epi-up fixed on the pads. Otherwise, bottom incidence type photodiodes can be epi-down mounted on the pads for sensing light signals for the $WDM_2$.

Holes $J_a$, $J_b$, $J_c$ and $J_d$ are perforated on the bottom 5 of the middle case 1 for guiding light beams λ3 reflected by the $WDM_2$ of the middle floor B. Preamplifiers $AMP_{2a}$, $AMP_{2b}$, $AMP_{2c}$ and $AMP_{2d}$ are installed in the vicinity of the photodiodes $PD_{2a}$, $PD_{2b}$, $PD_{2c}$ and $PD_{2d}$ for preamplifying photocurrents induced in the photodiodes. The lower floor C has electric elements 40 for shielding photodiode circuits from external noise. A plurality of leadpins 43 and 44 are fixed in holes of the side walls 39 and 39 of the lower case 3.

Metallized patterns 42 formed on the bottom 35 are joined by wires 45 and 46 to the leadpins 43 and 44. Details of wirings between the metallizes and the leadpins are omitted in the figures.

Wires 49 connect the photodiodes $PD_2$s to the preamplifiers $AMP_2$s. Some of the electric elements 40 are joined by wires (omitted) to the $PD_2$s and $AMP_2$s. The leadpins are provided to the case by insert-molding a leadframe with a resin in a metallic mold.

The three cases are unified by piling the middle case 1 upon the lower case 3, piling the upper case 2 on the middle case 1 and gluing the piled three with an adhesive. In the coupled three-stories, the first set of photodiodes $PD_{1a}$, $PD_{1b}$, $PD_{1c}$ and $PD_{1d}$ on the highest floor A are positioned above the lightwaveguides $G_a$, $G_b$, $G_c$ and $G_d$ on the middle floor. The second set of photodiodes $PD_{2a}$, $PD_{2b}$, $PD_{2c}$ and $PD_{2d}$ in the bottom case 3 align just beneath the lightwaveguides $G_a$, $G_b$, $G_c$ and $G_d$ on the middle floor B.

The first set of photodiodes $PD_{1a}$, $PD_{1b}$, $PD_{1c}$ and $PD_{1d}$ on the top floor A is located on loci of the upward beams reflected by the $WDM_1$ and passing the bottom holes. The second set of photodiodes $PD_{2a}$, $PD_{2b}$, $PD_{2c}$ and $PD_{2d}$ on the bottom floor C is located on loci of the downward beams reflected by the $WDM_2$.

The top floor (the highest case A) is supplied with a transparent fluid resin 50 of a low refractive index, for example, an acrylate (thermosetting or ultraviolet setting) resin or silicone (thermosetting or ultraviolet setting) resin. The resin fluid passes the holes 27 and 28 and arrives at the middle floor (B). The resin fills the middle floor. Then, the fluid resin passes the holes 47 and 48 and fills the bottom floor (C). The transparent resin 50 protects the PDs, LDs, WDMs and wires.

In the top floor A, the transparent resin 50 is in tight contact with the first set of photodiodes $PD_{1a}$, $PD_{1b}$, $PD_{1c}$ and $PD_{1d}$, the first set of preamplifiers $AMP_{1a}$, $AMP_{1b}$, $AMP_{1c}$ and $AMP_{1d}$, wires 29 and metallizes 22. In the middle floor B, the transparent resin 50 is in contact with the silicon bench 4, lightwaveguides, the set of laser diodes $LD_a$, $LD_b$, $LD_c$ and $LD_d$, the $WDM_1$ and $WDM_2$, wires 12 and leadpins 10. In the bottom floor C, the transparent resin 50 comes into contact with the second set of photodiodes $PD_{2a}$, $PD_{2b}$, $PD_{2c}$ and $PD_{2d}$, the second set of preamplifiers $AMP_{2a}$, $AMP_{2b}$, $AMP_{2c}$ and $AMP_{2d}$, wires 49 and metallizes 42.

The transparent resin 50 is a resin which is hardened by heat (thermosetting) or ultraviolet rays (ultraviolet setting). The hardened transparent resin 50 has a refractive index (1.4–1.5) similar to optical fibers (silica fibers). The transparent resin 50 decreases reflection loss at ends of fibers or lightwaveguides.

Three storey half products have been produced by the steps mentioned hitherto. The coupled upper case, the middle case and the bottom case are packaged by transfer-molding with an outer rigid resin. The outer resin is an opaque water-proof sturdy resin, for example, an epoxy resin.

Figure 4:
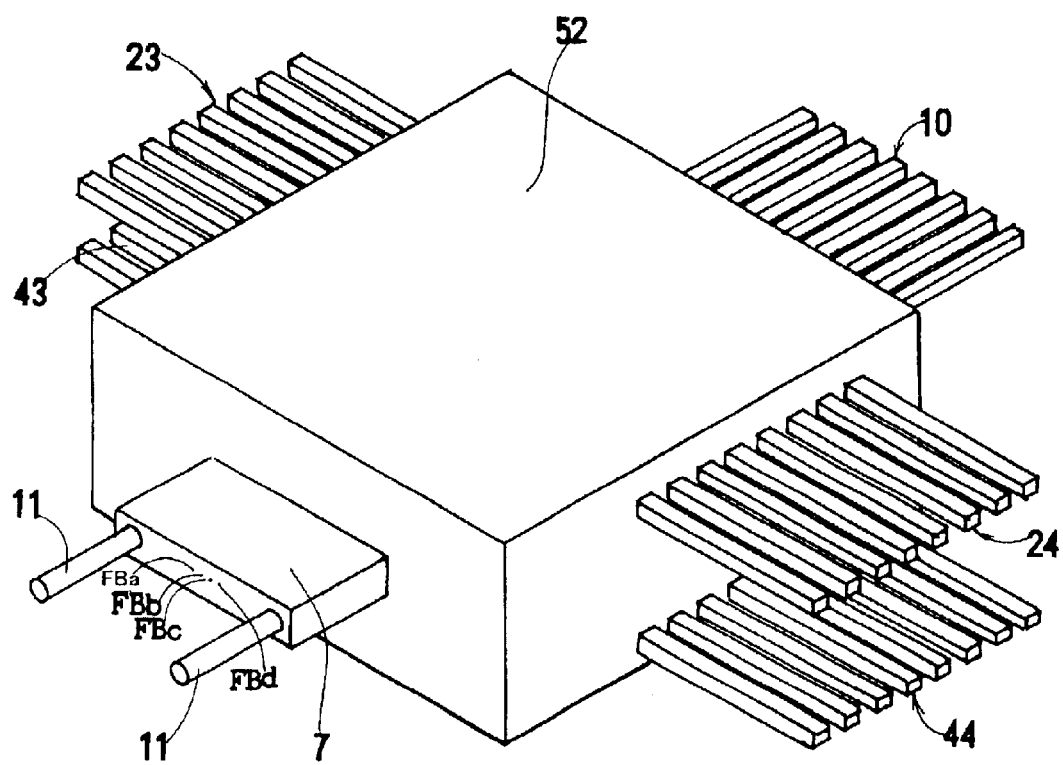
FIG. 4 is a perspective view of Embodiment 1 having the top case, the middle case and the bottom case, leadpins, a connector and a resin package enclosing the cases.

FIG. 4 is a perspective view of a resin packaged optical communications module. The whole is enclosed by a resin package 52. Parallel leadpins 10 for laser diodes extend backward from the package 52. The LD leadpins are parts of a middle LD leadframe. The top floor (upper floor A) has $PD_1$ leadpins 23 and 24 extending from the sides. The bottom floor (lower floor C) has $PD_2$ leadpins 43 and 44 extending from the sides.

FIG. 4 shows a connector 7 at the front of the module. Ends of fibers $FB_a$, $FB_b$, $FB_c$ and $FB_d$ appear on the forefront of the connector 7. The pitch of the fibers is 250 μm (0.25 mm). Four fibers stretch in a width of 250 μm×3+125 μm=875 μm. Guidepins 11 enable the module to attach to or detach from a ribbonfiber connector. In this example, this module has a 10 mm width, a 35 mm length and a 6 mm height.

The functions of the three-storied communications modules of the present invention are described. The middle floor (B) contains an M channel λ1 transmitting (LD) portion. The top floor (A) has an M channel λ2 receiving (PD) portion. The bottom floor (C) has an M channel λ3 receiving (PD) portion.

The laser diodes $LD_a$, $LD_b$, $LD_c$ and $LD_d$ on the middle floor (B) generate transmitting light signal beams of a λ1 band. The transmitting signal beams propagate in the lightwaveguides $G_a$, $G_b$, $G_c$ and $G_d$ on the silicon bench, go into the element fibers $FB_a$, $Fb_b$, $FB_c$ and $FB_d$ and run in the fibers to counterpart subscribers or central stations.

λ2 receiving signal beams running in the fibers $FB_a$, $FB_b$, $FB_c$ and $FB_d$ go into the lightwaveguides and are reflected by the first $WDM_1$ upward. The λ2 beams pass the holes $H_a$, $H_b$, $H_c$ and $H_d$ and enter the photodiodes $PD_{1a}$, $PD_{1b}$, $PD_{1c}$ and $PD_{1d}$, which yield photocurrents in proportional to the signals. The photocurrents are amplified by the neighboring preamplifiers $AMP_{1a}$, $AMP_{1b}$, $AMP_{1c}$ and $AMP_{1d}$. Amplified electric signals are output via wires and leadpins to outer circuits.

λ3 receiving signal beams running in the fibers $FB_a$, $FB_b$, $FB_c$ and $FB_d$ go into the lightwaveguides and are reflected by the second $WDM_2$ downward. The λ3 beams pass the holes $J_a$, $J_b$, $J_c$ and $J_d$ and enter the photodiodes $PD_{2a}$, $PD_{2b}$, $PD_{2c}$ and $PD_{2d}$ which yield photocurrents in proportional to the signals. The photocurrents are amplified by the neighboring preamplifiers $AMP_{2a}$, $AMP_{2b}$, $AMP_{2c}$ and $AMP_{2d}$. Amplified electric signals are output via wires and leadpins to outer circuits.

[Fabrication of Embodiment 1 (four-channel PD/LD/PD module)]

Production processes of Embodiment 1 are described. Straight polymer lightwaveguides $G_a$, $G_b$, $G_c$ and $G_d$ of a 250 μm pitch are produced. In practice, a 1 mm thick single crystal silicon wafer of a diameter of 20 cm to 30 cm is prepared. Lightwaveguides, V-grooves, steps and metallizes are produced on predetermined chip areas assumed on the wafer by wafer-processing. Then, the silicon wafer is scribed and divided into a plurality of silicon bench chips of 1.5 mm×7.5 mm.

A transparent core/cladding resin is coated on the silicon wafer by a spin coating method. The cladding layer is formed to a 10 μm thickness on the silicon wafer. The core layer is made into a 5 μm thickness. The core layer is formed into 6.5 μm wide separated core lines by photolithography with dry etching. A cladding layer of a 10 μm thickness is further formed upon the core lines and the cladding layer. A cladding/core/cladding triplet waveguide structure is made. The core has a section of a 5 μm height and 6.5 μm width. Waveguides mean cores in the triplet structure.

Two slanting grooves of a 20 μm width are cut across the lightwaveguides $G_a$, $G_b$, $G_c$ and $G_d$ on the silicon bench by dicing processing. Normals of the slanting grooves are slanting to the lightwaveguides at ±30 degrees. The first $WDM_1$ and the second $WDM_2$ are inserted and fixed in the slanting grooves. The lower steps behind the final ends of the lightwaveguides are metallized. The hitherto described steps (of making steps, lightwaveguides, metallizes and grooves) are done on the silicon wafer by wafer processing. The round wafer is scribed and cut into silicon benches of 1.5 mm×7.5 mm×1 mm.

After the processed wafer has been divided into individual chips, 1.3 μm laser diodes (LDs) $LD_a$, $LD_b$, $LD_c$ and $LD_d$ are die-bonded on a rear part behind the lightwaveguides with an AuSn solder. The LDs are easily and exactly aligned to the lightwaveguides $G_a$, $G_b$, $G_c$ and $G_d$ by marks which have been preliminarily printed on a rear part of the silicon bench. Wavelength division multiplexers $WDM_1$ and $WDM_2$ are inserted and fixed in the slanting grooves. The WDMs are made by piling a plurality of sets of at least two different kinds of dielectric films in turn on a polymer substrate. The first $WDM_1$ has a function of reflecting 30 degree slantingly forward incidence 1.48 μm (λ2) beams and permitting 30 degree slanting rearward incidence LD beams of 1.3 μm (λ1) to pass. The second $WDM_2$ has a function of reflecting 30 degree slantingly forward incidence 1.55 μm (λ3) beams and permitting 30 degree slanting rearward incidence LD beams of 1.3 μm (λ1) to pass.

The middle case 1 is made by insert-molding a liquid crystal polymer with a leadframe with wiring patterns in a mold. The middle case 1 has a 5 mm width, a 25 mm length and a 1.5 mm height. Holes for leading resins, holes for admitting light beams and a cavity for supporting the silicon bench 4 are formed on the middle case 1. The processed silicon bench 4 is embedded on the cavity of the middle case 1.

The upper (top) case 2 is made by insert-molding a liquid crystal polymer with a leadframe in a mold. The leadframe has wiring patterns for the first set of photodiodes $PD_1$s and the first set of preamplifiers $AMP_1$s and 0.1 mm φ bottom holes $H_a$, $H_b$, $H_c$ and $H_d$ for guiding light beams. The metallic leadframe is made of a metallic thin plate by punching holes and patterns. The size of the top case is a 5 mm width, a 25 mm length and a 1.5 mm height.

The first set of photodiodes PDs and preamplifiers $AMP_1$s is bonded on the wiring patterns of the leadframe on the top case 2. Optionally, capacitors, coils and resistors are bonded on the leadframe by silver(Ag) paste for the sake of noise shielding. The figures show capacitors as an example. The electric elements are not indispensable. 25 μm φ Au wires are wirebonded for connecting wiring patterns to electrode pads on the photodiodes PDs and the preamplifiers $AMP_1$s.

The bottom case 3 is also produced by insert-molding a liquid crystal polymer with a leadframe in a mold. The leadframe has wiring patterns for photodiodes $PD_2$s and preamplifiers $AMP_2$s. The bottom case 3 has a size of 5 mm×25 mm×1.5 mm.

The second set of photodiodes $PD_2$s and the second set of preamplifiers $AMP_2$s are mounted on the wiring patterns on the leadframe of the bottom case 3. Sometimes, capacitors, coils and resistors are fitted on the leadframe by Ag-paste for attenuating external noise. Electrode pads of the photodiodes $PD_2$s and the preamplifiers $AMP_2$s are joined to wiring patterns on the leadframe by 25 μm φ Au wires.

Preliminarily marks have been allotted to a set of photodiode chips $PD_2$s fixed upon the bottom case 3. The marks should be inscribed on predetermined spots on the silicon bench and predetermined spots on the middle case 1. The bottom case 3 and the middle case 1 are unified by observing the middle case marks (bench marks) and bottom marks by image-processing through a microscope, positioning the middle and bottom cases at predetermined places by the observation of the bench marks and the case marks, supplying an ultraviolet setting resin to the cases 1 and 3, laying the middle case 1 just upon the bottom case 3, irradiating the resin by ultraviolet rays and fitting the middle case 1 to the bottom case 3. A similar process joins the top case 2 to the middle case 1. Then, the three-storied structure is built up.

Finally, the three-storied cases are resin-packaged by transfermolding into a pertinent shape with a hard resin, as shown in FIG. 4. The size of the packaged module is 10 mm×35 mm×6 mm.

Figure 5:
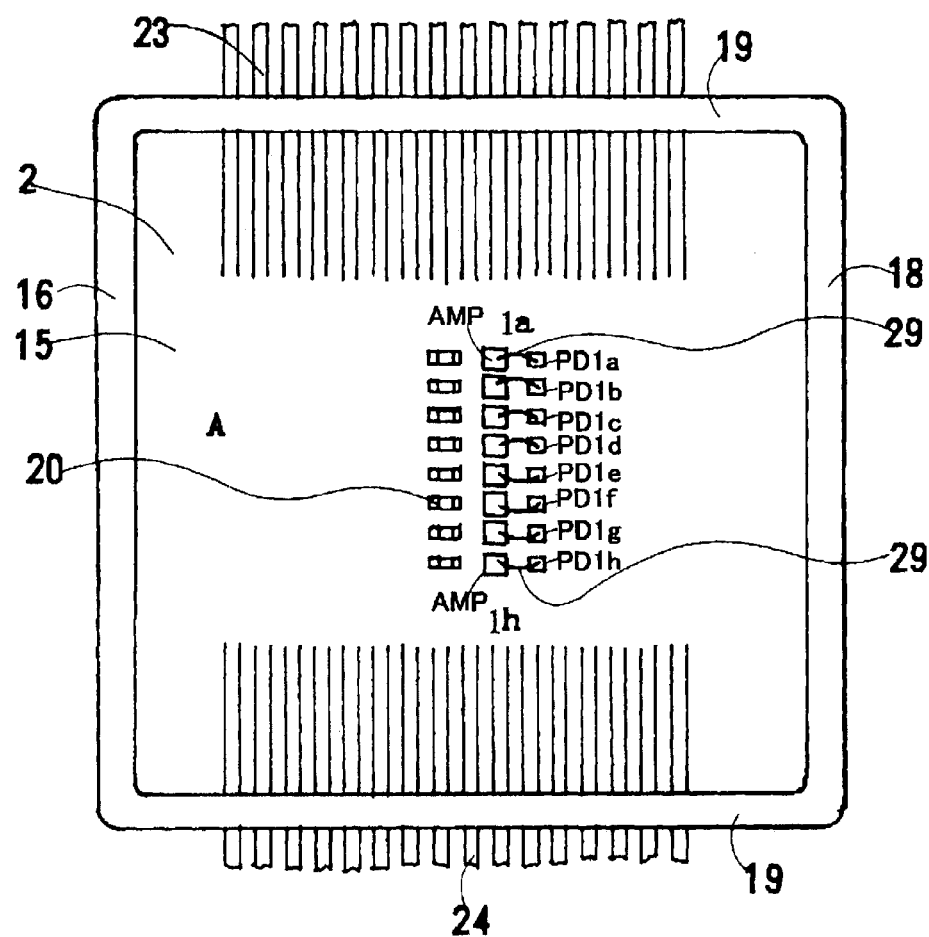
FIG. 5 is a plan view of a top case of Embodiment 2 of an eight channel PD/LD/PD module.
Figure 6:
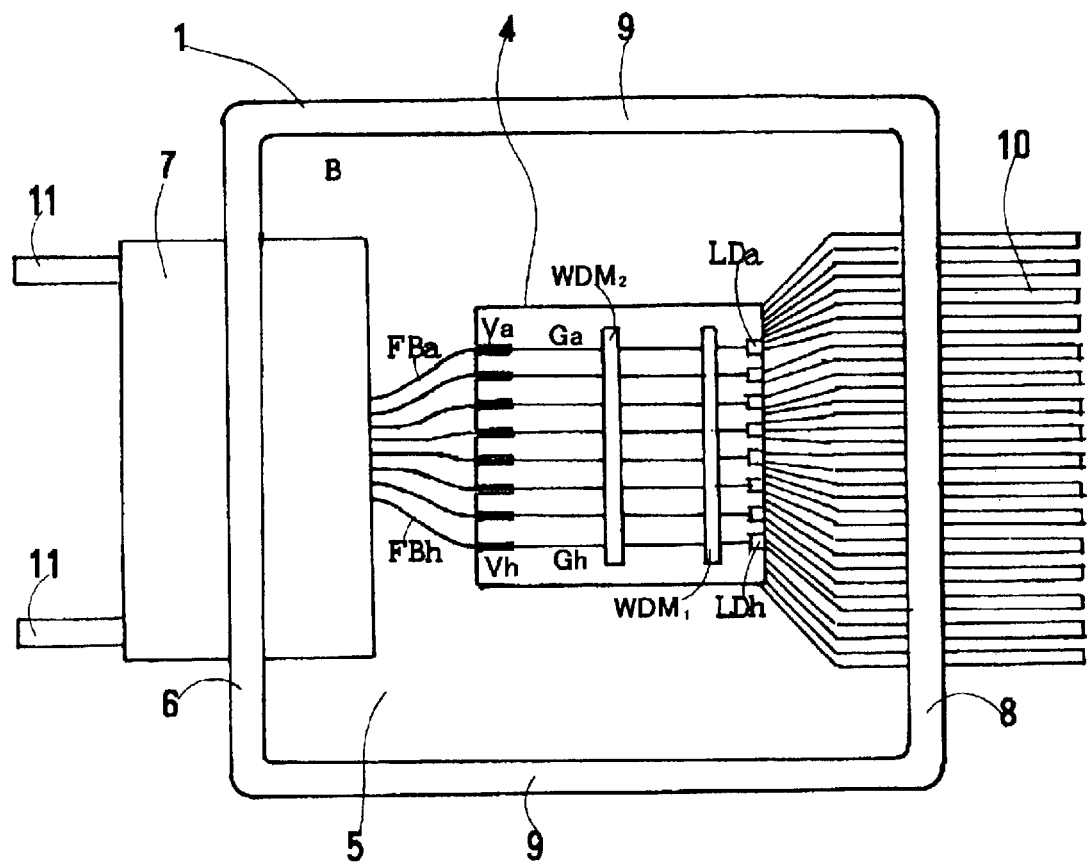
FIG. 6 is a plan view of a middle case of Embodiment 2 of the eight channel PD/LD/PD module.
Figure 7:
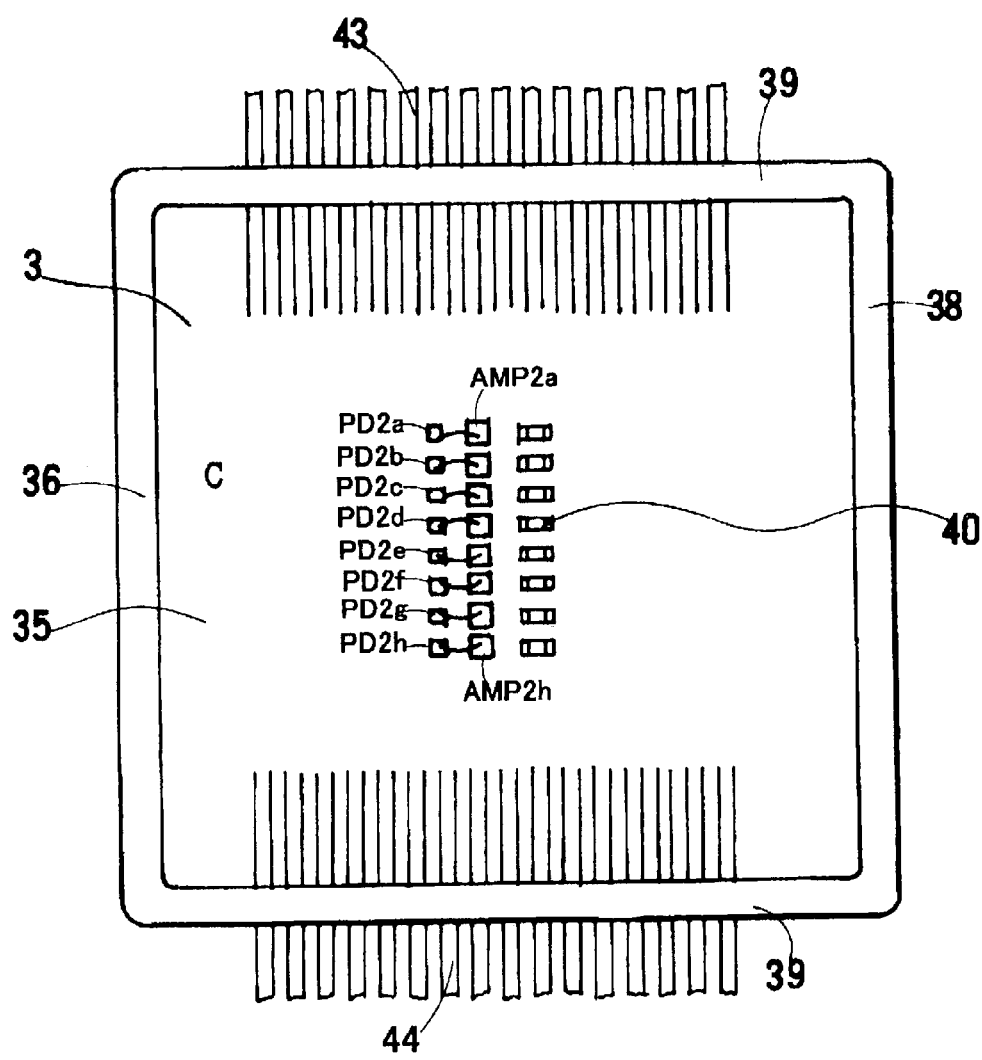
FIG. 7 is a plan view of a bottom case of Embodiment 2 of the eight channel PD/LD/PD module.
Figure 8:
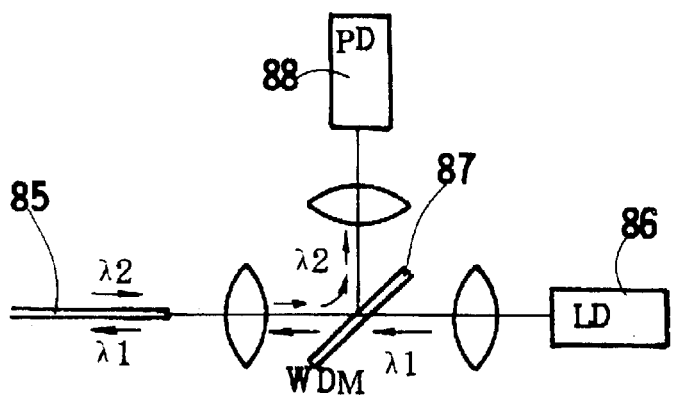
FIG. 8 is a plan view of a conventional LD/PD module arranging an optical fiber, a photodiode ($\lambda$2) and a laser diode ($\lambda$1) in three vertical directions and placing a WDM at a center for allowing a $\lambda$1 laser beam to pass and for reflecting a $\lambda$2 beam to the photodiode.
Figure 9:
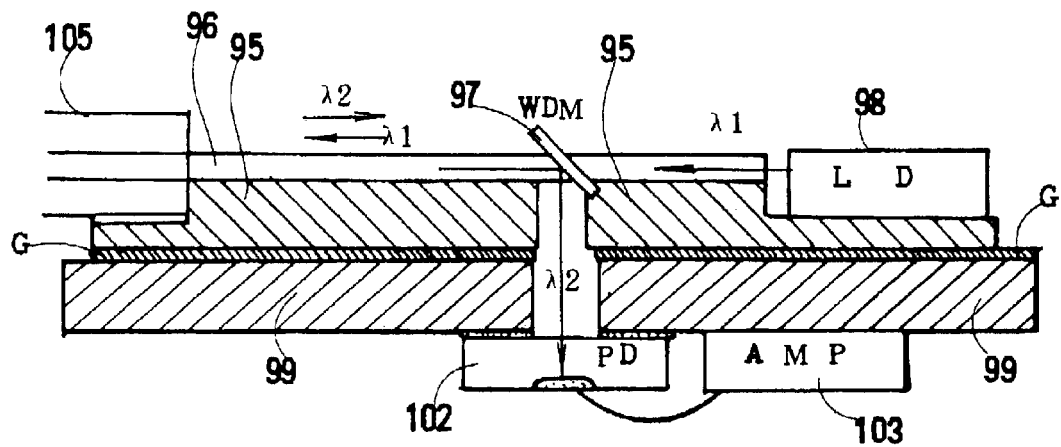
FIG. 9 is a vertically sectioned view of a planar type LD/PD module proposed by Japanese Patent Laying Open No. 11-218651.

[EMBODIMENT 2 (M=8, $PD_1$/LD/$PD_2$; FIGS. 5 to 7)]

This invention has an advantage of reducing a necessary space, which is conspicuous in multichannel communications systems. Then, an eight channel case (M=8) is now described with referring to FIG. 5, FIG. 6 and FIG. 7. The M=8 module has a fundamental structure similar to the M=4 module of Embodiment 1.

FIG. 5 is a plan view of an upper (top) case 2. In FIG. 5, the top case 2 has a bottom plate 15, a front wall 16, a rear wall 18, and side walls 19 and 19. The bottom plate 15 has metallized patterns and a leadframe with leadpins 23 and 24. FIG. 5 omits details of the metallized patterns. Eight photodiodes $PD_{1a}$, $PD_{1b}$, $PD_{1c}$, ..., $PD_{1h}$, for receiving a λ2 band are mounted on the metallizes of the top case 2. Preamplifiers $AMP_{1a}$, $AMP_{1b}$, $AMP_{1c}$, ..., $AMP_{1h}$ are installed in the vicinity of the photodiodes. Besides, the photodiodes and the preamplifiers, electric elements 20, for example, capacitors, coils or resistors, are installed on wiring patterns on the bottom plate 15. The optoelectronic chips (PDs), the AMPs, the electric elements and the wiring patterns are joined by wires.

FIG. 6 is a plan view of a middle case 1. The middle case 1 has a bottom plate 5, a front wall 6, a rear wall 8, and side walls 9 and 9. The bottom plate 5 has a central cavity and resin leading holes. A rectangular silicon bench 4 is stored on the central cavity. The silicon bench 4 has been provided with V-grooves, lightwaveguides, metallized patterns and slanting grooves by evaporation, CVD, photolithography or printing at the stage of a silicon wafer in the wafer-process. The silicon wafer is scribed and cut into a plurality of benches. The silicon bench 4 has eight V-grooves $V_a$, $V_b$, $V_c$, ..., $V_h$, eight lightwaveguides $G_a$, $G_b$, $G_c$, ..., $WDM_1$, a $WDM_2$ and eight laser diodes $LD_a$, $LD_b$, $LD_c$, ..., $LD_h$. An MT connector 7 having eight tails of an eight channel ribbonfiber is fixed on a front hole of the front wall 6 of the middle case 1. The tails of the ribbonfiber are inserted and fixed in the V-grooves. The laser diodes $LD_a$, $LD_b$, $LD_c$, ..., $LD_h$, metallized patterns, and leadframe 10 are connected by wires.

FIG. 7 is a plan view of a bottom case 3. The bottom case 3 comprises a bottom plate 35, a front wall 36, a rear wall 38 and side walls 39 and 39. The bottom plate 35 has embedded leadpins and printed metallized patterns. FIG. 7 omits details of the metallized patterns. Eight photodiodes $PD_{2a}$, $PD_{2b}$, ..., $PD_{2h}$ are die-bonded on metallized pads on the bottom plate. Preamplifiers $AMP_{2a}$, $AMP_{2b}$, $AMP_{2c}$, ..., $AMP_{2h}$ are furnished on metallized patterns in the vicinity of the photodiodes for amplifying photocurrents of the photodiodes. Further electric elements 40 (capacitors, resistors) are upholstered on the bottom plate. The optoelectronic chips, the preamplifiers, and the electric elements are connected by wires.

Embodiment 2 is completed by piling the bottom case 3, the middle case 1 and the upper case 2 in this order, gluing the cases together, injecting a transparent resin 50 into the cases, and molding the whole with a rigid outer resin 52 into a plastic packaged device.

We claim:

1. A three-storied optical communications module comprising:

a top case having a first set of M (M<1) photodiodes for receiving M-channel λ2 light signals, bottom holes, electric wirings and leadpins;

a silicon bench having M parallel longitudinal V-grooves,

M parallel lightwaveguides following the V-grooves, a first wavelength division multiplexer slantingly mounted midway across the lightwaveguides for reflecting the λ2 light signals and allowing λ1 light signals to pass, a second wavelength division multiplexer slantingly mounted halfway across the lightwaveguides for reflecting λ3 light signals and allowing the λ1 light signals to pass, and M laser diodes mounted at rear ends of the lightwaveguides for generating the M-channel λ1 light signals and introducing the M-channel λ1 signals into the lightwaveguides;

a middle case having a connector maintaining beginning ends of M-channel optical fibers with tails supported on the V-grooves of the silicon bench, bottom holes, electric wirings, leadpins and the silicon bench;

a bottom case having a second set of M photodiodes for receiving M-channel λ3 light signals, electric wirings and leadpins;

the top case, the middle case and the bottom case being coupled in a body, and a transparent resin filled in the top, middle and bottom cases, the electric wirings of the top case being electrically separated from the electric wirings of the middle case, the electric wirings of the middle case being electrically separated from the electric wirings of the bottom case, the λ1 light signals being emitted from the laser diodes, passing the first wavelength division multiplexer and the second wavelength division multiplexer and going into the M-channel optical fibers, the λ2 light signals being input from the M-channel optical fibers, propagating in the lightwaveguides, being reflected by the first wavelength division multiplexer passing the bottom holes of the top case and entering the first set of photodiodes on the top case, and the λ3 light signals being input from the M-channel optical fibers, propagating in the lightwaveguides, being reflected by the second wavelength division multiplexer, passing the bottom holes of the middle case and entering the second set of photodiodes on the bottom case.

2. The three-storied optical communications module according to claim 1, wherein M preamplifiers are mounted near the first set of M photodiodes for amplifying photocurrents yielded in the first set of photodiodes on the top case.

3. The three-storied optical communications module according to claim 1, wherein M preamplifiers are mounted near the second set of M photodiodes for amplifying photocurrents yielded in the second set of photodiodes on the bottom case.

4. The three-storied optical communications module according to claim 1, wherein the bottom case, the middle case and the top case are resin cases unified with leadframes with the leadpins by insert-molding.

5. The three-storied optical communications module according to claim 4, wherein the bottom case, the middle case and the top case are resin cases having wiring patterns.

6. The three-storied optical communications module according to claim 1, wherein the bottom case, the middle case and the top case are ceramic cases having wiring patterns and leadpins joined to the wiring patterns.

7. The three-storied optical communications module according to claim 1, wherein the lightwaveguides are made of a polymer.

8. The three-storied optical communications module according to claim 1, wherein the lightwaveguides are made of silicon dioxide.

9. The three-storied optical communications module according to claim 1, wherein the channel number M is $2^m$, where m is an integer.

10. The three-storied optical communications module according to claim 9, wherein the channel number M is 1, 2, 4, 8, 16 or 32.

11. The three-storied optical communications module according to claim 1, wherein the channel number M is a multiple of four.

12. The three-storied optical communications module according to claim 11, wherein the channel number M is 4, 8, 12, 16 or 24.

13. The three-storied optical communications module according to claim 1, wherein the transparent resin is a thermosetting or ultraviolet setting silicone resin having a refractive index nearly equal to the lightwaveguides.

14. The three-storied optical communications module according to claim 1, wherein the transparent resin is a thermosetting or ultraviolet setting acrylate resin having a refractive index nearly equal to the lightwaveguides.

15. The three-storied optical communications module according to claim 1, wherein the first wavelength division multiplexer and the second wavelength division multiplexer are made by piling two different kinds of dielectric films in turn on a polymer substrate.

16. The three-storied optical communications module according to claim 1, wherein the first wavelength division multiplexer and the second wavelength division multiplexer are made by piling two different kinds of dielectric films in turn on a glass substrate.

17. The three-storied optical communications module according to claim 1, wherein the top case, the middle case and the bottom case have capacitors, coils and resistors for removing noise by stabilizing applied source voltage.

18. The three-storied optical communications module according to claim 1, wherein the $\lambda 1$ is a 1.3 $\mu$m band, the $\lambda 2$ is a 1.48 $\mu$m band, and the $\lambda 3$ is a 1.55 $\mu$m band.

19. The three-storied optical communications module according to claim 18, wherein the $\lambda 1$ is a 1.3 $\mu$m band, the $\lambda 2$ is a digital 1.48 $\mu$m band, and the $\lambda 3$ is an analog 1.55 $\mu$m band.

20. The three-storied optical communications module according to claim 1, wherein the top case, the middle case and the bottom case are glued together with an ultraviolet setting adhesive.

* * * * *